United States Patent
Cabral, Jr. et al.

(10) Patent No.: US 8,158,449 B2
(45) Date of Patent: Apr. 17, 2012

(54) PARTICLE EMISSION ANALYSIS FOR SEMICONDUCTOR FABRICATION STEPS

(75) Inventors: Cyril Cabral, Jr., Mahopac, NY (US); Michael S. Gordon, Yorktown Heights, NY (US); Jeff McMurray, Layton, UT (US); Liesl M. McMurray, legal representative, Kaysville, UT (US); Cristina Plettner, Cologne (DE); Paul Andrew Ronsheim, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 592 days.

(21) Appl. No.: 12/247,474

(22) Filed: Oct. 8, 2008

(65) Prior Publication Data
US 2010/0084656 A1    Apr. 8, 2010

(51) Int. Cl.
 *H01L 21/00*   (2006.01)
(52) U.S. Cl. ....... 438/56; 438/10; 438/17; 257/E31.086; 257/E31.119
(58) Field of Classification Search ............ 438/10, 438/17, 56, 57, 66, 73, 60, 75, 11, 18, 48; 257/429, E31.086, E31.119, E25.004, E25.005, 257/E25.009, E25.01, E21.521, E21.529, 257/E21.522, E31.089, E31.09, 428; 250/308, 250/370.02
See application file for complete search history.

(56) References Cited

U.S. PATENT DOCUMENTS

| | | | | |
|---|---|---|---|---|
| 4,871,914 A * | 10/1989 | Simon et al. | ............. | 250/370.02 |
| 5,489,780 A * | 2/1996 | Diamondis | ............. | 250/370.02 |
| 5,854,506 A * | 12/1998 | Fallica | ............. | 257/429 |
| 5,987,483 A * | 11/1999 | Edelkind et al. | ............. | 708/250 |
| 6,479,825 B1 * | 11/2002 | Weiss | ............. | 250/370.02 |
| 6,645,789 B2 * | 11/2003 | Bernstein et al. | ............. | 438/57 |
| 2003/0026374 A1 * | 2/2003 | Ruddy et al. | ............. | 376/153 |
| 2003/0030444 A1 * | 2/2003 | Kogawa et al. | ............. | 324/464 |
| 2003/0040877 A1 * | 2/2003 | Warburton et al. | ............. | 702/78 |
| 2004/0200968 A1 * | 10/2004 | Shibutani et al. | ............. | 250/370.02 |
| 2006/0186959 A1 * | 8/2006 | Arques | ............. | 330/277 |
| 2007/0290126 A1 * | 12/2007 | Kurkoski et al. | ............. | 250/262 |
| 2008/0258057 A1 * | 10/2008 | Williamson et al. | ............. | 250/308 |
| 2009/0039270 A1 * | 2/2009 | Cabral et al. | ............. | 250/366 |
| 2009/0045464 A1 * | 2/2009 | Woo | ............. | 257/362 |
| 2009/0057562 A1 * | 3/2009 | Heijne et al. | ............. | 250/370.07 |
| 2011/0051901 A1 * | 3/2011 | Michel et al. | ............. | 378/165 |

* cited by examiner

*Primary Examiner* — Matthew Landau
*Assistant Examiner* — Joseph C Nicely
(74) *Attorney, Agent, or Firm* — Schmeiser, Olsen & Watts; Louis J. Percello

(57) ABSTRACT

A structure and a method for operating the same. The method includes providing a detecting structure which includes N detectors. N is a positive integer. A fabrication step is simultaneously performed on the detecting structure and M product structures in a fabrication tool resulting in a particle-emitting layer on the detecting structure. The detecting structure is different than the M product structures. The M product structures are identical. M is a positive integer. An impact of emitting particles from the particle-emitting layer on the detecting structure is analyzed after said performing is performed.

15 Claims, 9 Drawing Sheets

PARTICLE EMISSION ANALYSIS FOR SEMICONDUCTOR FABRICATION STEPS

FIELD OF THE INVENTION

The present invention relates generally to semiconductor fabrication and more particularly to particle emission analysis for semiconductor fabrication steps.

BACKGROUND OF THE INVENTION

A conventional integrated circuit (chip) has many layers and regions that may emit alpha particles (each having 2 neutrons and 2 protons). These emitted alpha particles may cause soft errors in the chip. Therefore, there is a need for structures (and methods for operating the same) for analyzing the alpha particle emission rates of these layers and regions.

SUMMARY OF THE INVENTION

The present invention provides a method, comprising providing a detecting structure which includes N detectors, N being a positive integer; simultaneously performing in a fabrication tool a fabrication step on the detecting structure and M product structures resulting in a particle-emitting layer on the detecting structure, wherein the detecting structure is different than the M product structures, wherein the M product structures are identical, and wherein M is a positive integer; and analyzing an impact of emitting particles from the particle-emitting layer on the detecting structure after said performing is performed.

The present invention provides structures (and methods for operating the same) for analyzing the alpha particle emission rates of these layers and regions.

BRIEF DESCRIPTION OF THE DRAWINGS

FIG. 2' illustrates a fabrication step to be analyzed on 3 identical product wafers and the segmented detecting wafer of FIG. 2 in a chamber, in accordance with embodiments of the present invention.

DETAILED DESCRIPTION OF THE INVENTION

FIGS. 1A-1I show cross-section views used to illustrate a fabrication process of a semiconductor structure 100, in accordance with embodiments of the present invention. More specifically, with reference to FIG. 1A, the fabrication process of the semiconductor structure 100 can start with a silicon substrate 110. The substrate 110 can be doped with n-type dopants. The dopant concentration of the substrate 110 is around $1\times10^{11}$ to $1\times10^{13}$ dopant atoms/cm$^3$. Lower dopant concentrations (higher resistivities) and lower impurity/defect incorporation are preferred.

Figure 1A:
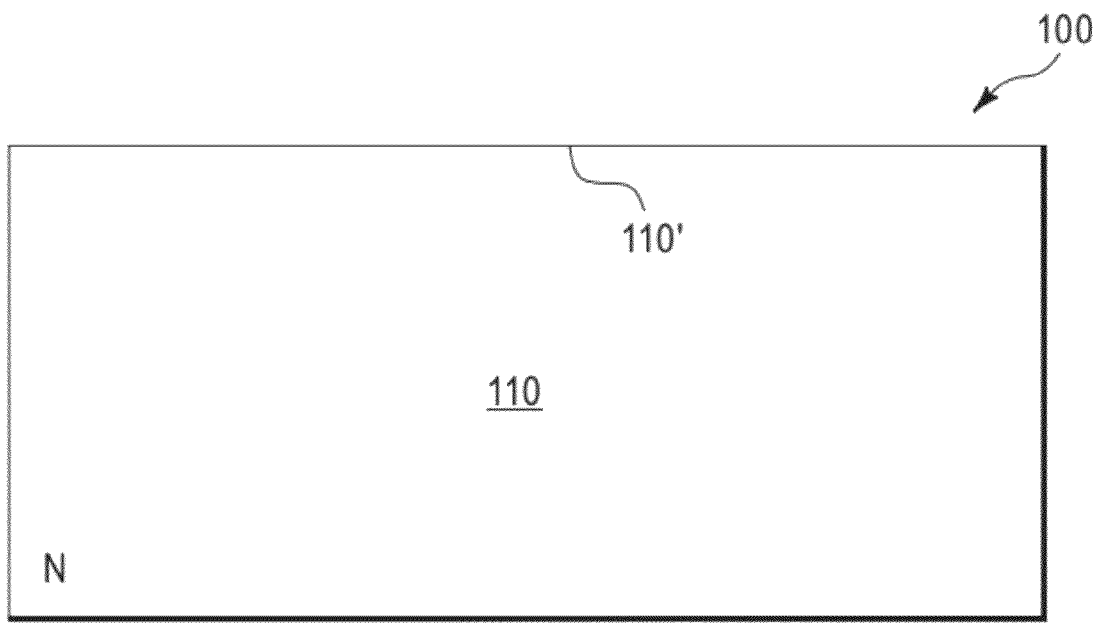
FIGS. 1A-1I show cross-section views used to illustrate a fabrication process of a semiconductor structure, in accordance with embodiments of the present invention.
Figure 1B:
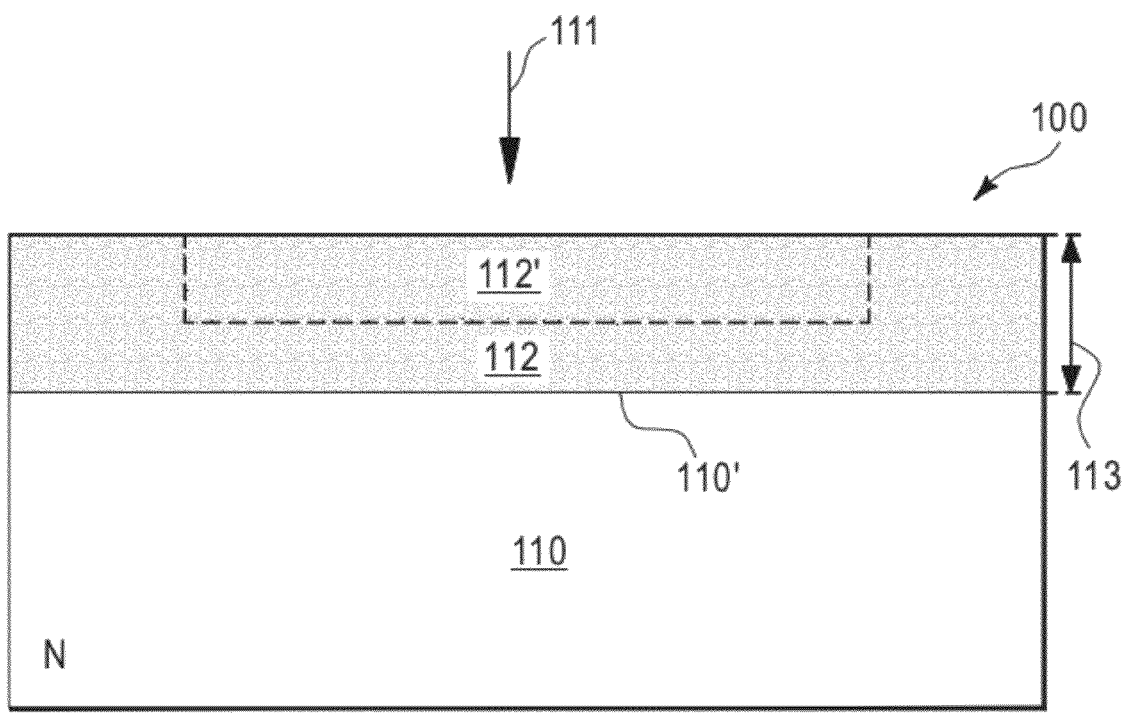

Next, with reference to FIG. 1B, in one embodiment, a dielectric layer 112 is formed on top of the substrate 110. The dielectric layer 112 can comprise silicon dioxide. The thickness 113 of the dielectric layer 112 can be around 100 nm to 500 nm. If silicon dioxide is used, the dielectric layer 112 can be formed by thermally oxidizing the top surface 110' of the substrate 110 (FIG. 1A) at 900° C. to 1050° C. resulting in the dielectric layer 112.

Figure 1C:
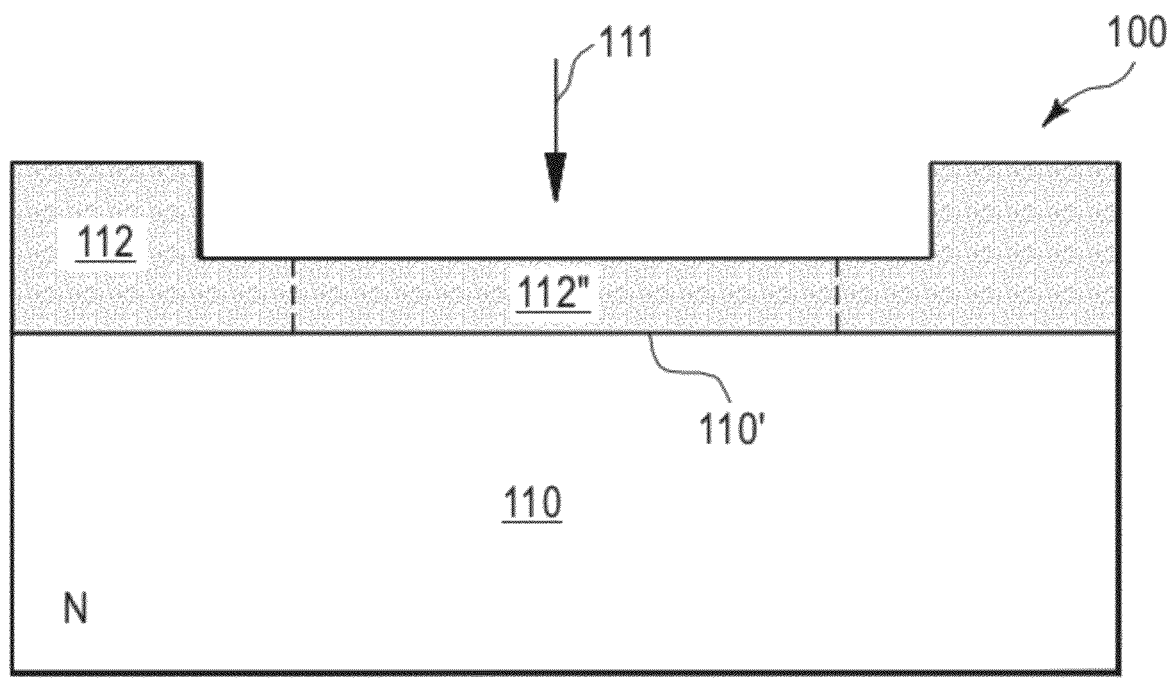

Next, in one embodiment, a portion 112' of the dielectric layer 112 is removed resulting in the dielectric layer 112 of FIG. 1C. The portion 112' can be removed by lithographic patterning and etching processes. The etching of the portion 112' can be performed in a vertical direction represented by an arrow 111 perpendicular to the top surface 110' of the substrate 110. A reactive ion etch (RIE) or wet etch process may be used.

Figure 1D:
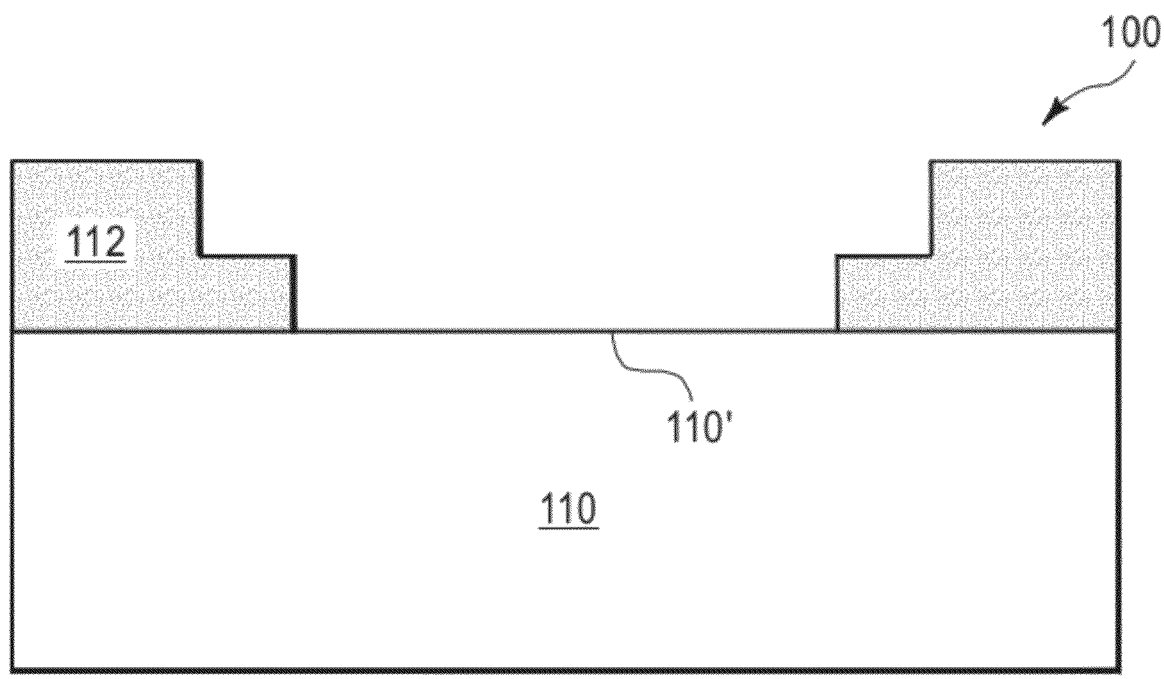

Next, with reference to FIG. 1C, in one embodiment, a portion 112" of the dielectric layer 112 is removed such that the top surface 110' of the substrate 110 is exposed to the surrounding ambient, as shown in FIG. 1D. The portion 112" can be removed by lithographic patterning and etching processes. The etching of the portion 112" can be performed in the vertical direction represented by the arrow 111. A reactive ion etch (RIE) or wet etch process may be used.

Figure 1E:
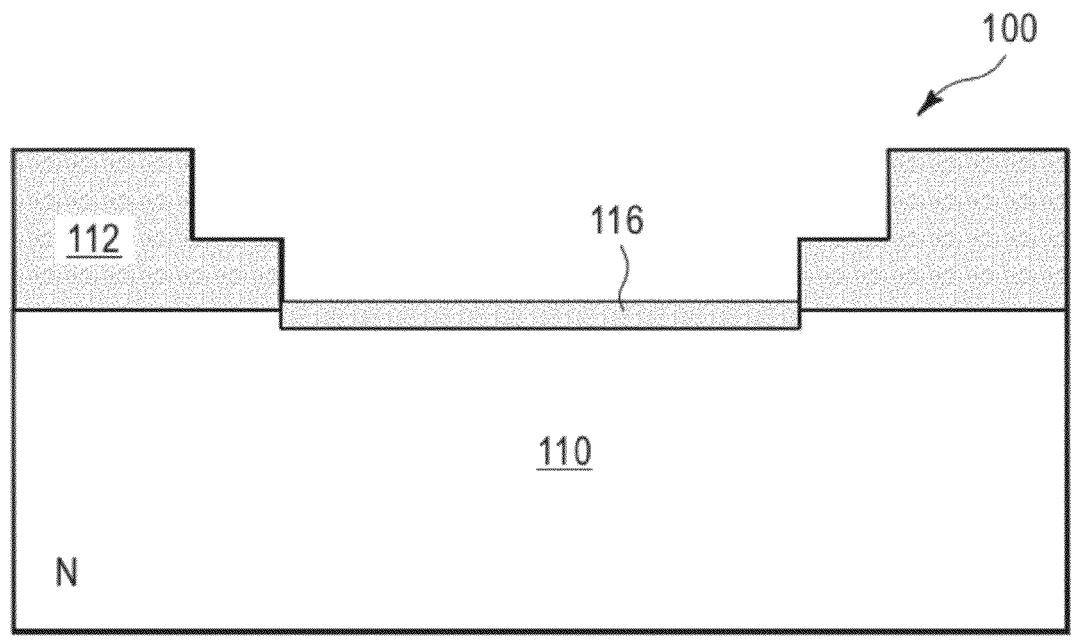

Next, with reference to FIG. 1E, in one embodiment, a passivation region 116 is formed on exposed-to-ambient surface 110' (FIG. 1D) of the substrate 110. The passivation region 116 can comprise silicon dioxide. If silicon dioxide is used, the passivation region 116 can be formed by thermally oxidizing the exposed-to-ambient surface 110' (FIG. 1D) of the substrate 110 resulting in the passivation region 116.

Figure 1F:
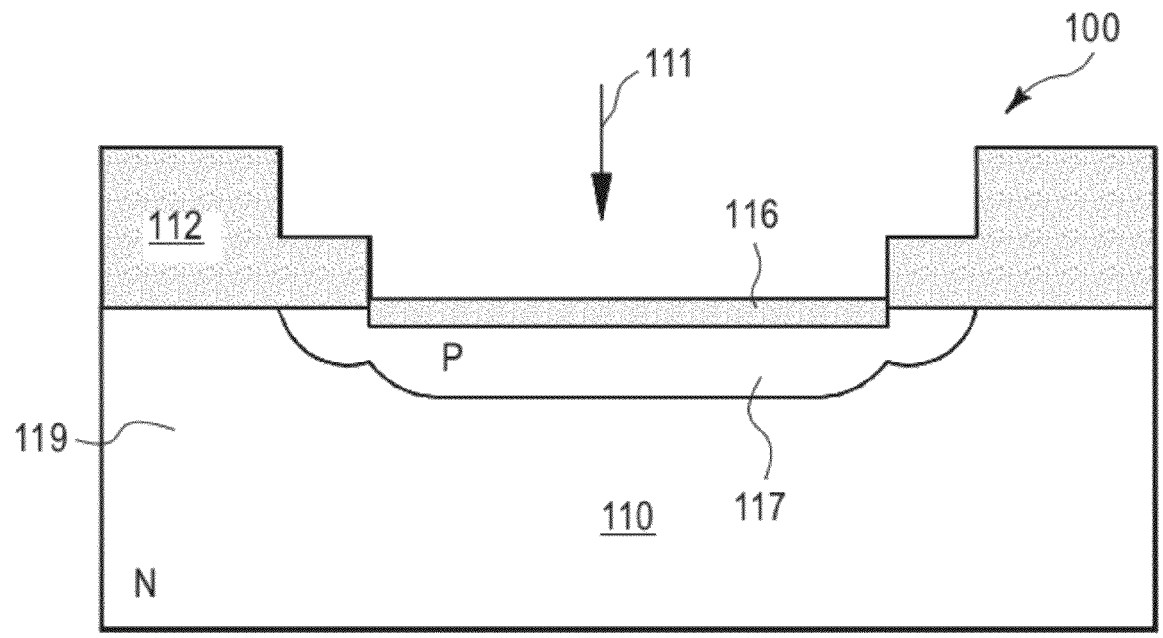

Next, with reference to FIG. 1F, in one embodiment, a P region 117 is formed in the substrate 110. The rest of the substrate 110 (i.e., other than the P region 117) can be referred to as an N region 119. The dopant concentration of the P region 117 can be about $5\times10^{17}$ to $5\times10^{21}$ dopant atoms/cm$^3$. The P region 117 can be formed by ion implanting p-type dopants in the vertical direction represented by the arrow 111 into the substrate 110 resulting in the P region 117. The energy of each ion incident on the substrate 110 can be in the range of 10-15 keV. After that, the P region 117 can be annealed to activate the p-type dopants in the P region 117. The P region 117 can be annealed at a temperature in the range of 800° C.-1000° C. for 5 seconds. Alternatively, the P region 117 can be annealed at a temperature in the range of 600° C.-800° C. for 30-60 minutes. It should be noted that the P region 117 is in direct physical contact with the N region 119 resulting in a P-N junction 117+119.

Figure 1G:
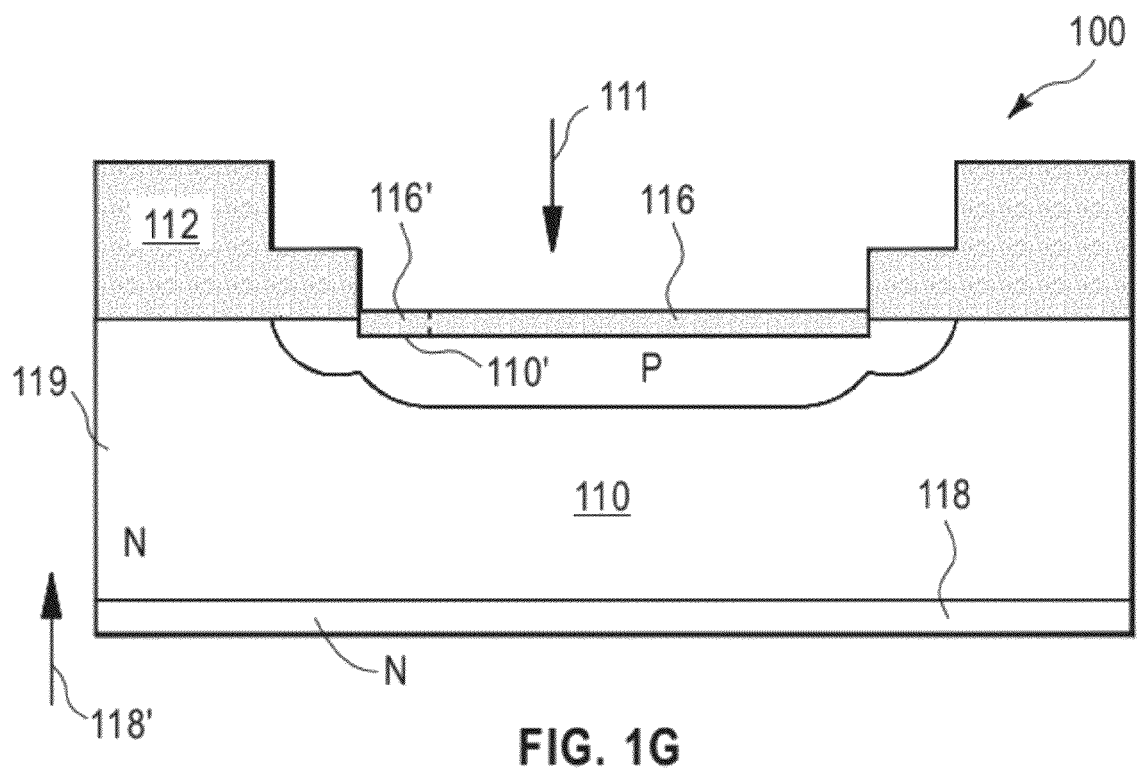

Next, with reference to FIG. 1G, in one embodiment, an N region 118 is formed at bottom of the substrate 110. The dopant concentration of the N region 118 can be about $5\times10^{17}$ to $5\times10^{21}$ dopant atoms/cm$^3$. The N region 118 can be formed by ion implanting n-type dopants in the vertical direction represented by an arrow 118' into the substrate 110 resulting in the N region 118. The arrow 118' is parallel to but points in opposite direction with the arrow 111. The energy of each ion incident on the substrate 110 is about 25-35 keV. After that, the N region 118 can be annealed to activate the n-type dopants in the N region 118. The N region 118 can be annealed at a temperature in the range of 800° C.-1000° C. for 1 second. The N region 118 helps provide electrical access to the N region 119.

Next, in one embodiment, a portion 116' of the passivation region 116 is removed resulting in the top surface 110' of the substrate 110 being exposed to the surrounding ambient. The portion 116' can be removed by lithographic patterning and etching processes. The etching of the portion 116' can be performed in the vertical direction represented by the arrow 111 resulting in the structure 100 of FIG. 1H. A reactive ion etch (RIE) or wet etch process may be used.

Figure 1H:
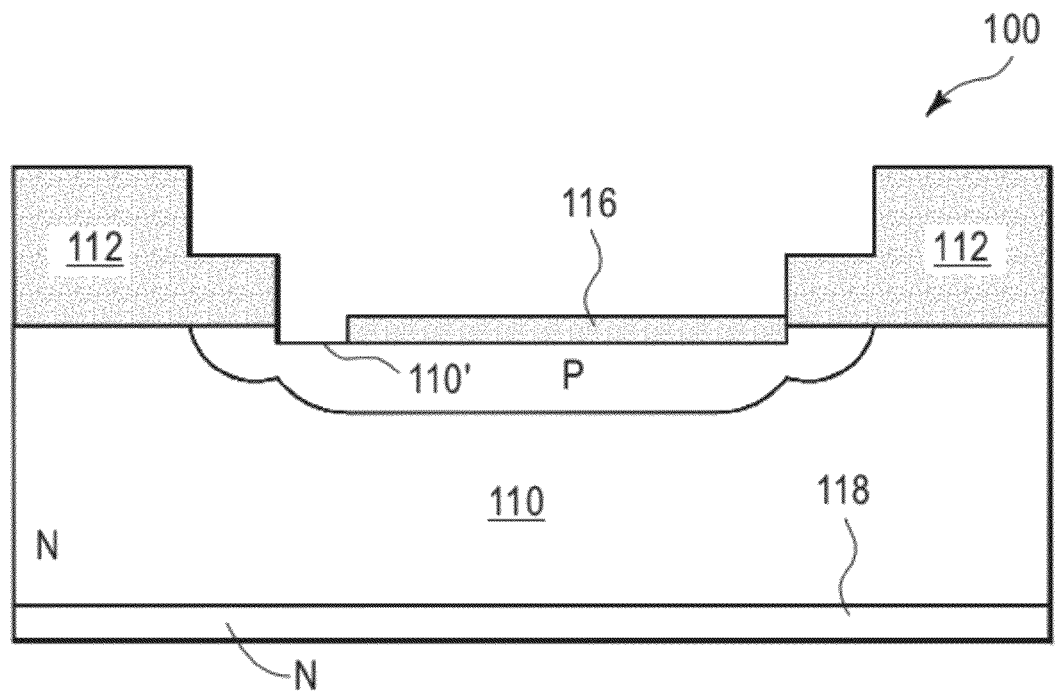
Figure 1I:
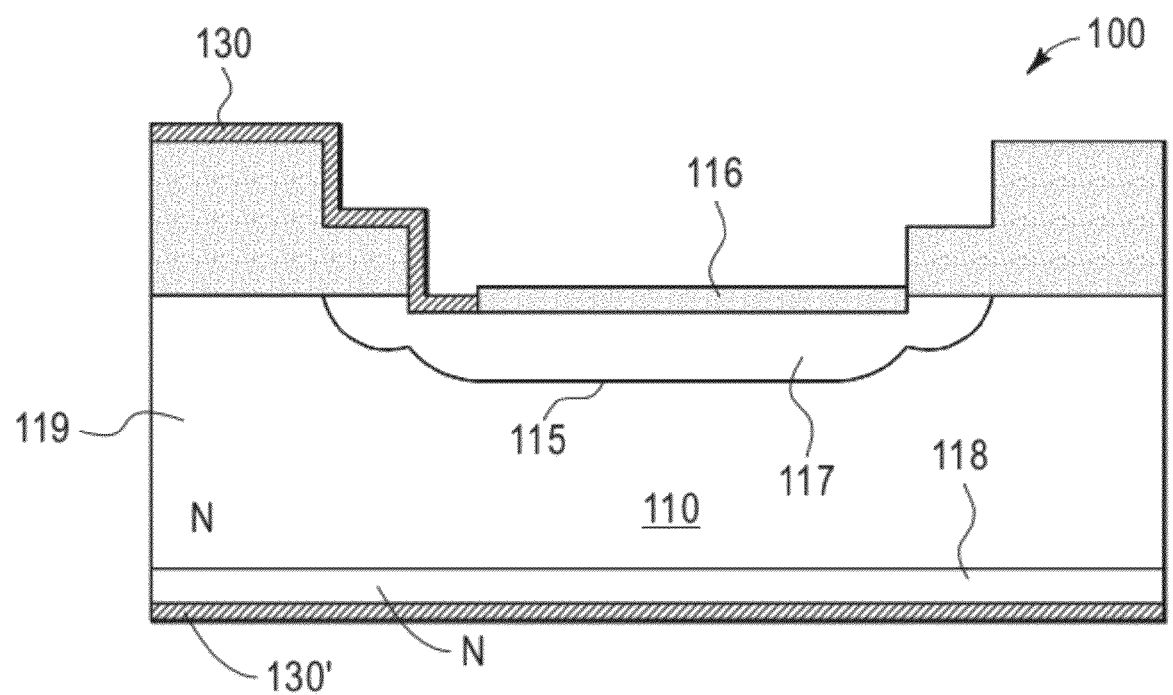

Next, with reference to FIG. 1I, in one embodiment, an electrically conductive region 130 is formed on top of the structure 100 of FIG. 1H such that the electrically conductive region 130 is in direct physical contact with the P region 117. The electrically conductive region 130 can be formed by a conventional metal lift-off process. Then, an electrically conductive region 130' can be formed at bottom of the substrate 110 such that the electrically conductive region 130' is in direct physical contact with the N region 118. The electrically conductive region 130' can be in direct physical contact with the entire bottom surface of the N region 118 or with only a certain smaller portion of the bottom surface of the N region 118.

It should be noted that the P region 117 is in direct physical contact with the N region 119 resulting in a P-N junction 117+119. The P-N junction 117+119 constitutes a diode structure 117+119. It should be noted that the electrically conductive regions 130 and 130' are electrically connected one-to-one to the P region 117 and the N region 119, respectively. Hereafter, the electrically conductive regions 130 and 130' can be referred to as an anode 130 and a cathode 130', respectively, of the diode structure 117+119. In one embodiment, the diode structure 117+119 is reversed biased when electrically connected. In this case, a lower potential is connected to the anode 130 and a higher potential is connected to the cathode 130'.

Figure 2:
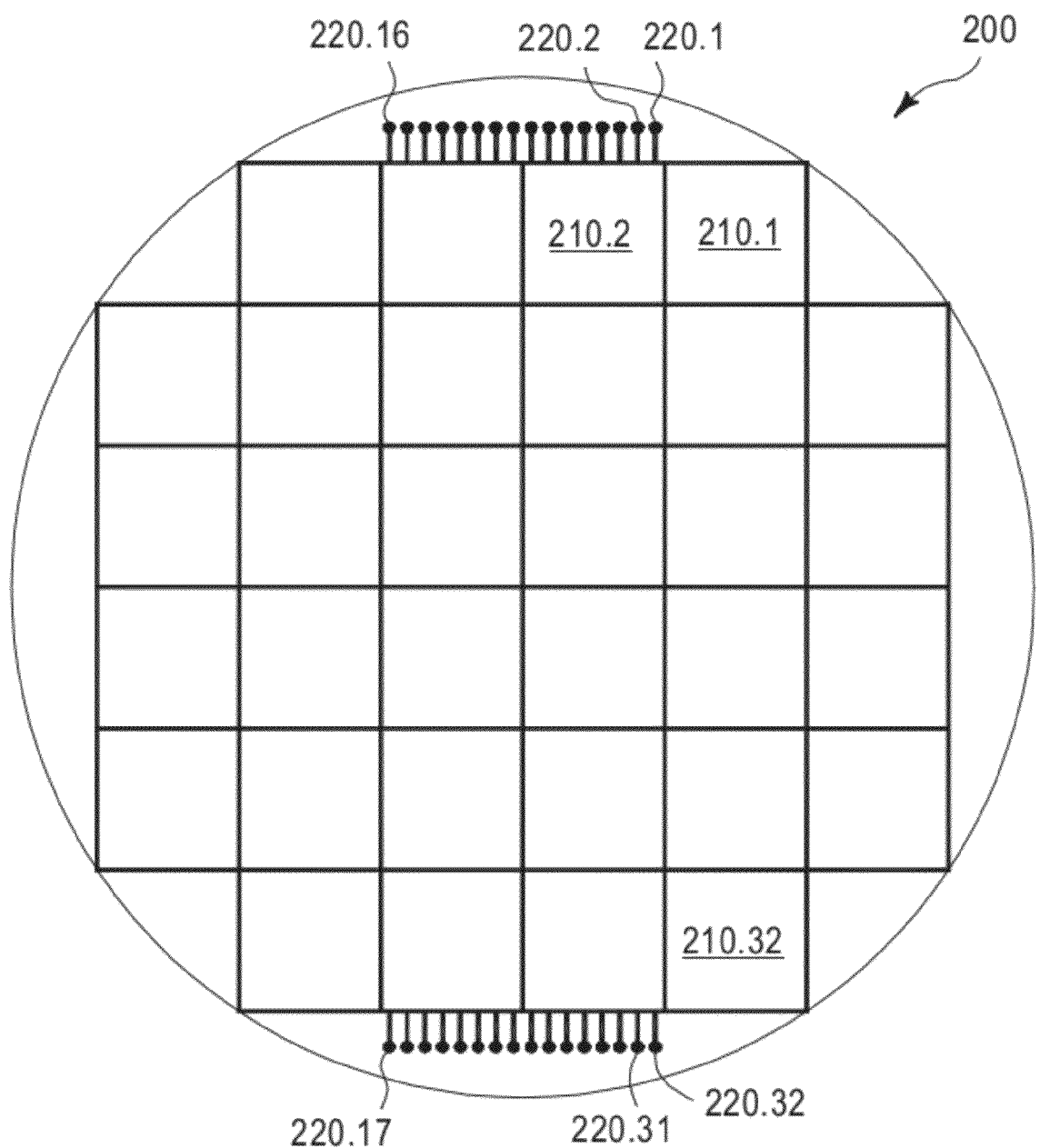
FIG. 2 shows a top-down view of a segmented detecting wafer, in accordance with embodiments of the present invention.
Figure 2:
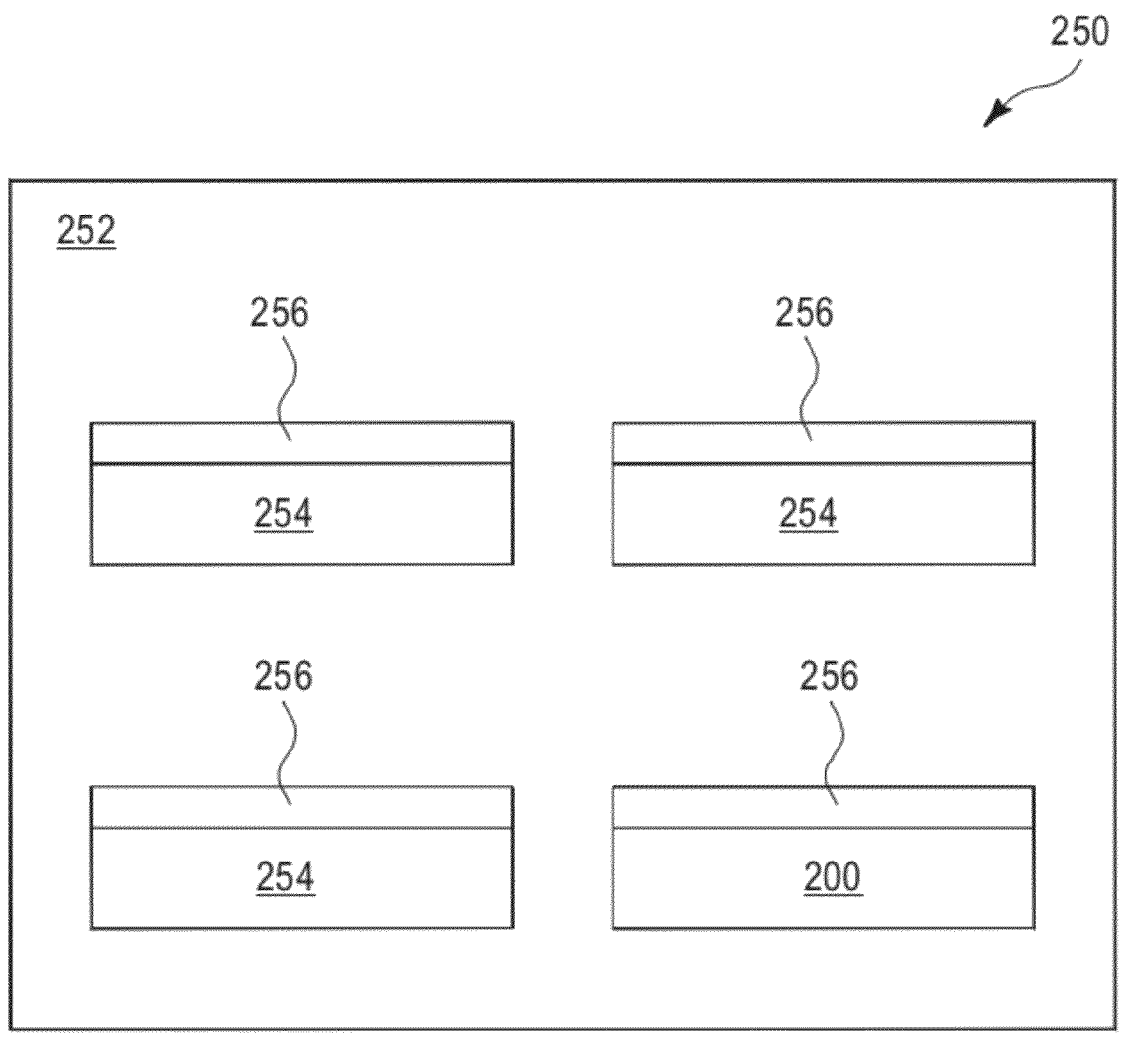

FIG. 2 shows a top-down view of a segmented detecting wafer 200, in accordance with embodiments of the present invention. The segmented detecting wafer 200 can comprise 32 detectors 210.1, 210.2, . . . , and 210.32. In one embodiment, each detector of the 32 detectors 210.1-210.32 has a cross-section view which is similar to that of the semiconductor structure 100 of FIG. 1I. More specifically, with reference to FIGS. 1I and 2, the 32 detectors 210.1-210.32 can share the same substrate 110. The 32 detectors 210.1-210.32 comprise a common N region 119 and 32 individual P regions 117. Similarly to the structure 100 of FIG. 1I, the 32 detectors 210.1-210.32 can function as 32 individual diode structures having 32 individual anodes 130 and a common cathode 130'.

The 32 individual anodes 130 can be electrically coupled one-to-one to 32 individual contact pads 220.1-220.32 at the edge of the segmented detecting wafer 200. The 32 individual anodes 130 provide electrical access to the 32 detectors 210.1-210.32. In one embodiment, the 32 detectors 210.1-210.32 can be formed simultaneously on the substrate 110 in a manner similar to the manner in which the structure 100 of FIG. 1I is formed.

In one embodiment, after the segmented detecting wafer 200 is formed, the segmented detecting wafer 200 can be used to detect alpha particles introduced as a result of a fabrication step in a fabrication line. In one embodiment, the segmented detecting wafer 200 can be used to detect alpha particles introduced as a result of the last fabrication step in the fabrication line. Assume that the fabrication step to be analyzed is the deposition of a metal on 3 identical product wafers 254 in a chamber 252, as shown in FIG. 2'. A product wafer is a wafer on which integrated circuits are formed. In one embodiment, the segmented detecting wafer 200 is different than the 3 product wafers 254.

With reference to FIG. 2', in one embodiment, the segmented detecting wafer 200 is placed in the same chamber 252. Then, the step of depositing the metal is performed resulting in metal layers 256 located on top of the product wafers 254 and the segmented detecting wafer 200. Assume that the product wafers 254 and the segmented detecting wafer 200 have the same size and shape (e.g., all have circular shape and all are 200 mm in diameter), then the impact in terms of depositing metal that may contain trace amounts of radioactive materials, emitting alpha particles, of the deposition step on the product wafers 254 can be analyzed by measuring the alpha particle emission on the segmented detecting wafer 200 that was coated with the metal along with the product wafers 254. In one embodiment, the metal layer 256, which emits alpha particles, is in direct pysical contact with the detecting wafer 200 as depicted in FIG. 2'.

Figure 3:
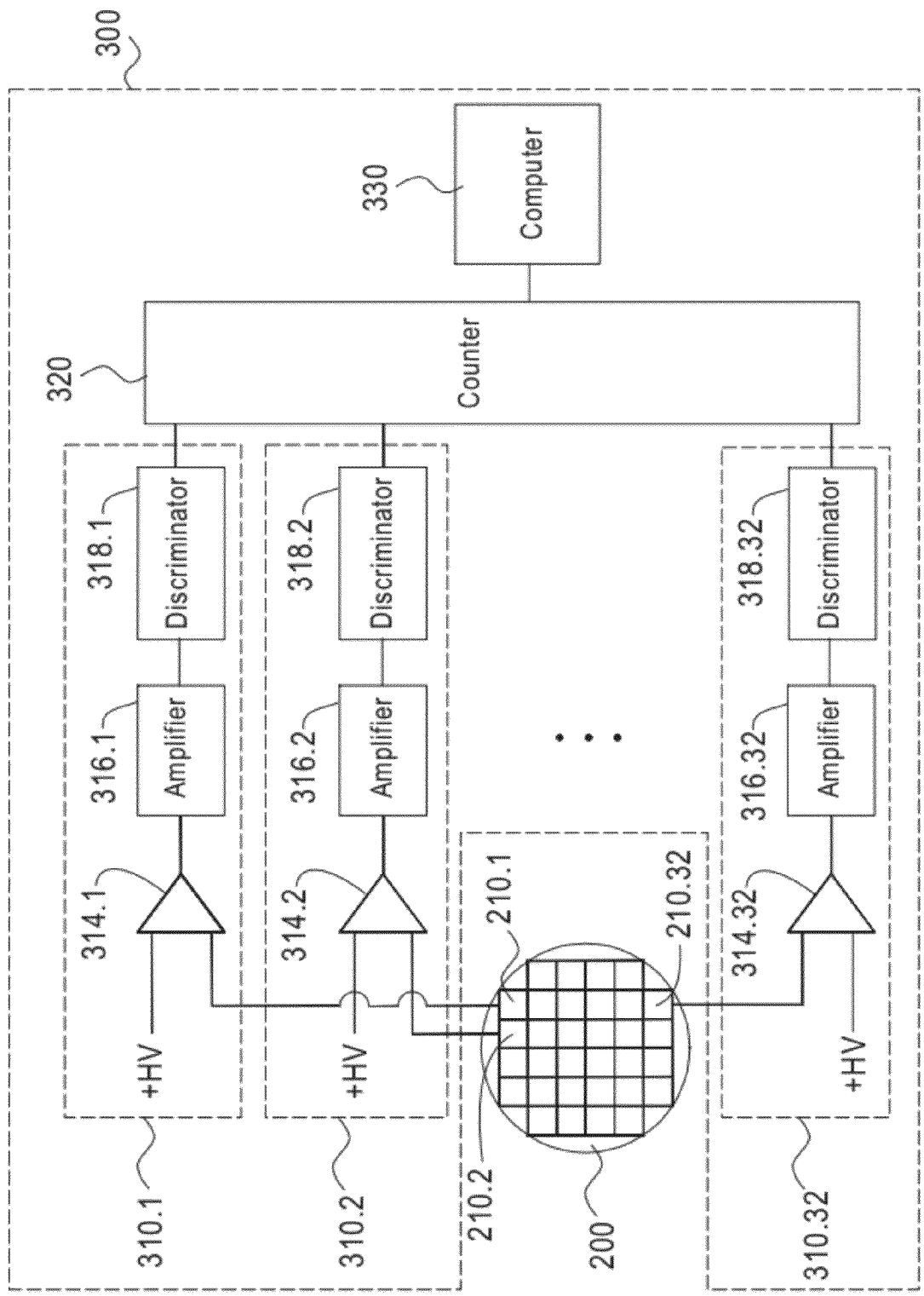
FIG. 3 shows a segmented detecting wafer electrically connected to an analyzing circuit, in accordance with embodiments of the present invention.

More specifically, after the deposition step is performed, the segmented detecting wafer 200 is removed from the chamber 252, and then electrically connected to an analyzing circuit 300 as shown in FIG. 3. With reference to FIG. 3, in one embodiment, the circuit 300 comprises 32 detecting circuits 310.1-310.32, a counter 320 electrically coupled to the 32 detecting circuits 310.1-310.32, and a computer 330 electrically coupled to the counter 320. The 32 detecting circuits 310.1-310.32 are electrically coupled one-to-one to the 32 individual anodes 130 of the 32 detectors 210.1-210.32 of the segmented detecting wafer 200 via the 32 contacts 220.1-220.32 (FIG. 2), respectively.

In one embodiment, the detecting circuit 310.1 comprises a pre-amplifier 314.1, an amplifier 316.1, and a discriminator 318.1. The pre-amplifier 314.1 is electrically coupled to a high voltage (+HV) power supply (not shown) and the anode 130 (FIG. 1I) of the detector 210.1. The amplifier 316.1 is electrically coupled to the pre-amplifier 314.1. The discriminator 318.1 is electrically coupled to the amplifier 316.1 and the counter 320. Each detecting circuit of the detecting circuits 310.2-310.32 is similar to the detecting circuit 310.1.

In one embodiment, the operation of the analyzing circuit 300 is as follows. With reference to FIGS. 2' and 3, after the segmented detecting wafer 200 is electrically connected to the analyzing circuit 300, assume that alpha particles are emitted from the deposited metal layer 256 on the segmented detecting wafer 200 and incident on the detector 210.1. The incidence of the alpha particles on the detector 210.1 of the segmented detecting wafer 200 results in a current pulse flowing into the pre-amplifier 314.1. Receiving the current pulse from the anode 130 of the detector 210.1, the pre-amplifier 314.1 converts the current pulse to a voltage pulse and then sends the voltage pulse to the amplifier 316.1. Then, receiving the voltage pulse, the amplifier 316.1 magnifies the voltage pulse and sends the magnified voltage pulse to the discriminator 318.1. Then, receiving the magnified voltage pulse, the discriminator 318.1 determines whether the amplitude of the magnified voltage pulse is greater than a discriminating amplitude value. If yes, the discriminator 318.1 generates an output pulse to the counter 320 causing the counter 320 to increment its count by one. Conversely, if the discriminator 318.1 determines that the amplitude of the magnified voltage pulse is less than the discriminating amplitude value, then the discriminator 318.1 does not generate the output pulse to the counter 320.

In one embodiment, the discriminating amplitude value is selected such that an alpha particle having an energy of at least a pre-specified energy (e.g., 1 MeV) incident on the detector 210.1 would cause the counter 320 to increment its count by one, whereas an alpha particle having an energy of less than 1 MeV incident on the detector 210.1 would not cause the counter 320 to increment its count by one. For example, the discriminating amplitude value can be set at 1V, and the pre-amplifier 314.1 and the amplifier 316.1 are configured such that the amplitude of the magnified voltage pulse is 1V in response to an alpha particle having energy of 1 MeV incident on the detector 210.1. This would ensure that an alpha particle having an energy of at least 1 MeV incident on the detector 210.1 causes the counter 320 to increment its count by one, and that an alpha particle having an energy of less than 1 MeV incident on the detector 210.1 does not cause the counter 320 to increment its count by one. In one embodiment, the configurations and operations of the detectors 210.2-210.32 are similar to the configuration and operation of the detector 210.1. In one embodiment, the counter 320 sums the counts from the 32 detectors 210.1-210.32 and generates the total number of counts to the computer 330.

In one embodiment, the discriminating amplitude value should be selected such that most noises in the system do not result in a magnified voltage pulse that exceeds the discriminating amplitude value.

In one embodiment, as long as the analyzing circuit 300 is electrically connected to the segmented detecting wafer 200, the analyzing circuit 300 can determine the total number of counts resulting from alpha particles having energies of at least 1 MeV incident on the 32 the detectors 210.1-210.32 of the segmented detecting wafer 200 in a pre-specified period of time (e.g., one day, one month, etc.). If the total number of counts exceeds a pre-specified maximum count (as determined by the computer 330), then the deposition tool 252 may be taken off-line and examined to determine the cause of the elevated alpha particle emission rate.

After the cause of the elevated alpha-particle emission rate is determined and rectified, another (second) segmented detecting wafer (not shown) similar to the segmented detecting wafer 200 of FIG. 2 can be placed in the chamber 252 and undergo the deposition step mentioned above. After that, the second segmented detecting wafer can be removed from the chamber 252 and connected to the analyzing circuit 300 for analysis during the pre-specified period of time. If the resulting total number of counts is below the pre-specified maximum count, the modifications made to the deposition tool 252 are considered satisfactory in terms of alpha particle emission.

In summary, after being removed from the chamber 252 of the deposition step, the segmented detecting wafer 200 is electrically coupled to the analyzing circuit 300. The analyzing circuit 300 can determine the total number of counts resulting from alpha particles generated from the deposited metal layer 256 and incident on the segmented detecting wafer 200 at least some energy level (e.g., 1 MeV) within a pre-specified period of time. From this total number of counts, it can be determined whether the deposition/fabrication step is satisfactory in terms of the emission of alpha particles.

Figure 4:
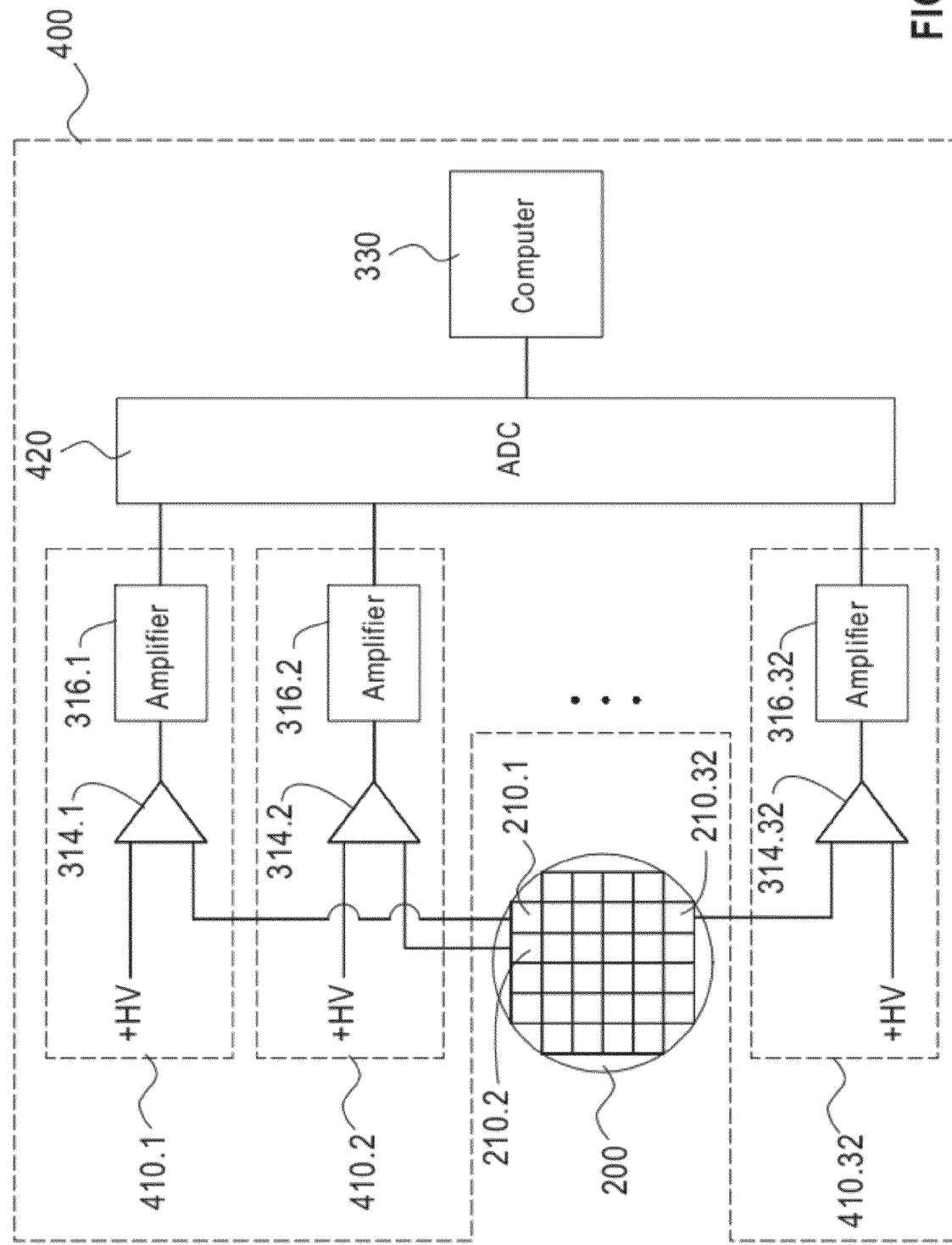
FIG. 4 shows a segmented detecting wafer electrically connected to another analyzing circuit, in accordance with embodiments of the present invention.

In an alternative embodiment, after the segmented detecting wafer 200 is removed from the chamber 252 (FIG. 2'), the segmented detecting wafer 200 is electrically connected to an analyzing circuit 400, as shown in FIG. 4, instead of to the analyzing circuit 300 of FIG. 3. With reference to FIG. 4, the circuit 400 comprises 32 detecting circuits 410.1-410.32, an ADC (Analog to Digital Converter) circuit 420 electrically coupled to the 32 detecting circuits 410.1-410.32, and a computer 330 electrically coupled to the ADC circuit 420. The 32 detecting circuits 410.1-410.32 are electrically coupled one-to-one to the 32 individual anodes 130 of the 32 detectors 210.1-210.32 of the segmented detecting wafer 200.

In one embodiment, the detecting circuit 410.1 is similar to the detecting circuit 310.1 of FIG. 3 except that the detecting circuit 410.1 does not have the discriminator 318.1. Similarly, each detecting circuit of the detecting circuits 410.2-410.32 is similar to the detecting circuit 410.1.

In one embodiment, the operation of the circuit 400 is as follows. With reference to FIGS. 2' and 4, after the segmented detecting wafer 200 is electrically connected to the analyzing circuit 400, assume that an alpha particle emitting from the deposited metal layer 256 on the segmented detecting wafer 200 is incident on the detector 210.1. The incidence of the alpha particles on the detector 210.1 of the segmented detecting wafer 200 results in a current pulse flowing into the pre-amplifier 314.1. Receiving the current pulse from the anode 130 of the detector 210.1, the pre-amplifier 314.1 converts the current pulse to a voltage pulse and then sends the voltage pulse to the amplifier 316.1. Then, receiving the voltage pulse, the amplifier 316.1 magnifies the voltage pulse and sends the magnified voltage pulse to the ADC circuit 420. In one embodiment, operations of the detectors 210.2-210.32 are similar to the operation of the detector 210.1. Alpha particles incident on the detectors 210.1-210.32 of the segmented detecting wafer 200 with energies larger than some certain energy thresholds (e.g., 1 MeV), can be recognized by the computer 330.

In one embodiment, the circuit 400 is configured such that an alpha particle having an energy of at least a pre-specified energy (e.g., 1 MeV) incident on any detector 210.X (X=1, 2, . . . , 32) would cause the computer 330 to increment an internal count by one, whereas an alpha particle having an energy of less than 1 MeV incident on any detector 210.X would not cause the computer 330 to increment its internal count by one. For example, the circuit 400 can be configured such that an alpha particle having an energy of at least 1 MeV incident on any detector 210.X would cause the ADC 420 to generate a digital output of at least 0100b ("b" indicates binary), and the computer 330 can be configured to increment its internal count only when it receives a digital output of at least 0100b from the ADC 420. The computer connected to the ADC should be able to form a histogram for each detector of the energy associated with each alpha particle. The counting incrementing is part of this.

In one embodiment, if the total number of internal counts exceeds a pre-specified maximum count (as determined by the computer 330), then the deposition tool 252 may be taken off-line and examined to determine the cause of the elevated alpha particle emission rate.

In summary, after being removed from the chamber 252 of the deposition step, the segmented detecting wafer 200 is electrically coupled to the analyzing circuit 400. The analyzing circuit 400 can determine the total number of counts resulting from alpha particles generated from the deposited metal layer 256 and incident on the segmented detecting wafer 200 at least some energy (e.g., 1 MeV) within a pre-specified period of time. From this total number of internal counts (histogram of alpha particle energies), it can be determined whether the deposition/fabrication step is satisfactory in terms of the emission of alpha particles.

In the embodiments described above, the segmented detecting wafer 200 comprises 32 detectors 210.1-210.32. In general, the segmented detecting wafer 200 can comprise N detectors (N is a positive integer), wherein each detector of the N detectors is similar to the detector 210.1 of FIG. 2.

In the embodiments described above, with reference to FIG. 1I, the region 117 is doped with p-type dopants whereas the regions 110, 119, and 118 are doped with n-type dopants. In an alternative embodiment, the region 117 is doped with n-type dopants whereas the regions 110, 119, and 118 are doped with p-type dopants.

In the embodiments described above, the fabrication step to be analyzed is the deposition of metal on the product wafers

254 (FIG. 2). In general, the fabrication step to be analyzed can be any fabrication step in the fabrication line.

In the embodiments described above, the segmented detecting wafer 200 experiences the same fabrication step as the product wafers 254 before being connected to the circuits 300/400 (FIGS. 3 and 4) for analysis. In an alternative embodiment, without experiencing any step of the fabrication line, the segmented detecting wafer 200 is connected to the circuits 300/400 (FIGS. 3 and 4) and is also placed in close proximity to a fully fabricated wafer (not shown) for collecting and analyzing the alpha particle emission rate from the fully fabricated wafer.

In the embodiments described above, the segmented detecting wafer 200 is placed in the chamber 252 with the product wafers 254, and the fabrication step is performed on all of them. In an alternative embodiment, only the segmented detecting wafer 200 (i.e., without the product wafers 254) is placed in the chamber 252 and the fabrication step is performed on only the segmented detecting wafer 200. After that, the segmented detecting wafer 200 is analyzed as described above.

In the embodiments described above, after the segmented detecting wafer 200 is formed, the segmented detecting wafer 200 is not calibrated before use. In an alternative embodiment, after the segmented detecting wafer 200 is formed, the segmented detecting wafer 200 is calibrated before use. More specifically, the segmented detecting wafer 200 is connected to the circuit 300 or 400 (FIGS. 3 and 4) depending on which of the two circuits will later be used to analyze the segmented detecting wafer 200. Then, the calibrating number of counts per unit time (background) resulting from any particles incident on the segmented detecting wafer 200 is determined. Then, the segmented detecting wafer 200 is disconnected from the circuit 300/400, then undergoes the deposition step, and then is connected again to the circuit 300/400 for analysis. After the total number of counts is determined as described above, the calibrating number of counts per unit time (background) is subtracted from the total number of counts per unit time to come up with the total effective number of counts per unit time.

For energy calibration purposes a known alpha emitter (i.e., $^{241}$Am source) is positioned near the segmented detecting wafer 200 and the gain for each amplifier 316.X is adjusted such that the appropriate alpha energy occurs at the designated ADC 420 channel number.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method, comprising:
   providing a detecting structure which includes N detectors, N being a positive integer;
   simultaneously performing in a fabrication tool a fabrication step on the detecting structure and M product structures resulting in a particle-emitting layer on the detecting structure,
   wherein the detecting structure is different than the M product structures,
   wherein the M product structures are identical,
   wherein M is a positive integer,
   wherein the detecting structure is on a detecting wafer,
   wherein the M product structures are on M product wafers, and
   wherein the detecting wafer and the M product wafers have a same size and shape; and
   analyzing an impact of emitting particles from the particle-emitting layer on the detecting structure after said performing is performed.

2. The method of claim 1, wherein the emitting particles comprise alpha particles.

3. The method of claim 1,
   wherein each detector of the N detectors comprises a p-type semiconductor region and an n-type semiconductor region in direct physical contact with each other so as to form a P-N junction, and
   wherein the N n-type semiconductor regions of the N detectors form a continuous block of an n-type semiconductor material.

4. The method of claim 1, wherein said analyzing comprises coupling the detecting structure to an analyzing circuit.

5. The method of claim 1, wherein said performing the fabrication step comprises depositing a metal on the detecting structure and the M product structures.

6. A method, comprising:
   providing a detecting structure which includes N detectors, N being a positive integer;
   simultaneously performing in a fabrication tool a fabrication step on the detecting structure and M product structures resulting in a particle-emitting layer on the detecting structure; and
   analyzing an impact of emitting particles from the particle-emitting layer on the detecting structure after said performing is performed,
   wherein the detecting structure is different than the M product structures,
   wherein the M product structures are identical,
   wherein M is a positive integer,
   wherein said analyzing comprises coupling the detecting structure to an analyzing circuit,
   wherein the analyzing circuit comprises:
      (i) N detecting circuits electrically coupled one-to-one to the N detectors of the detecting structure, wherein each detector of the N detectors is configured to generate a current pulse to the corresponding detecting circuit of the N detecting circuits in response to a particle incident on the detector,
      (ii) a collecting circuit electrically coupled to the N detecting circuits, and
      (iii) a computer electrically connected to the collecting circuit,
   wherein the detecting structure is on a detecting wafer, and
   wherein the particle-emitting layer is in direct physical contact with the detecting wafer,
   wherein the M product structures are on M product wafers, and
   wherein M layers emitting particles are on and in direct physical contact with respective product wafers of the M product wafers.

7. The method of claim 6,
   wherein each detecting circuit of the N detecting circuits comprises:
      (a) a pre-amplifier electrically coupled to the corresponding detector of the N detectors of the detecting structure;
      (b) an amplifier electrically coupled to the pre-amplifier; and
      (c) a discriminator electrically coupled to the amplifier and the collecting circuit, wherein the pre-amplifier is configured to receive the current pulse from the corresponding detector of the N detectors and convert the current pulse to a voltage pulse, wherein the amplifier is configured to magnify the voltage pulse into a magnified voltage pulse, wherein the pre-amplifier and the amplifier are configured such that if the incident particle has an energy of at least a pre-specified energy, then the magnified voltage pulse has an amplitude of at least a pre-specified discriminating amplitude value, wherein the discriminator is configured to generate an output pulse in response to the amplitude of the magnified voltage pulse being greater than the pre-specified discriminating amplitude value, wherein the collecting circuit comprises a counter, and wherein the counter is configured to increment its count by one in response to receiving the output pulse from the discriminator.

8. The method of claim 6, wherein each detecting circuit of the N detecting circuits comprises:
(i) a pre-amplifier electrically coupled to the corresponding of the N detectors of the detecting structure, and
(ii) an amplifier electrically coupled to the pre-amplifier, wherein the pre-amplifier is configured to receive the current pulse from the corresponding detector of the N detectors and convert the current pulse to a voltage pulse, wherein the amplifier is configured to magnify the voltage pulse into a magnified voltage pulse, wherein the collecting circuit comprises an ADC (Analog to Digital Converter) circuit, wherein the ADC circuit is configured to generate a digital output in response to receiving the magnified voltage pulse from the amplifier, and wherein the computer is configured to increment an internal count by one in response to a value of the digital output being greater than a pre-specified value.

9. A method, comprising:

providing a detecting structure which includes N detectors, N being a positive integer;

simultaneously performing a fabrication step on the detecting structure and M product structures resulting in a particle-emitting layer on the detecting structure, M being a positive integer; and analyzing an impact of emitting particles from the particle-emitting layer on the detecting structure after said performing is performed, wherein the detecting structure is on a detecting wafer, wherein the particle-emitting layer is in direct physical contact with the detecting wafer, wherein the M product structures are on M product wafers, and wherein M layers emitting particles are on and in direct physical contact with respective product wafers of the M product wafers.

10. The method of claim 9, wherein the emitting particles comprise alpha particles.

11. The method of claim 9, wherein each detector of the N detectors comprises a p-type semiconductor region and an n-type semiconductor region in direct physical contact with each other so as to form a P-N junction, and wherein the N n-type semiconductor regions of the N detectors form a continuous block of an n-type semiconductor material.

12. The method of claim 9, wherein said analyzing comprises coupling the detecting structure to an analyzing circuit.

13. A method, comprising:

providing a detecting structure which includes N detectors, N being a positive integer;

simultaneously performing a fabrication step on the detecting structure and M product structures resulting in a particle-emitting layer on the detecting structure, M being a positive integer; and analyzing an impact of emitting particles from the particle-emitting layer on the detecting structure after said performing is performed, wherein the detecting structure is on a detecting wafer, wherein the particle-emitting layer is in direct physical contact with the detecting wafer, wherein the M product structures are on M product wafers, wherein M layers emitting particles are on and in direct physical contact with respective product wafers of the M product wafers, wherein said analyzing comprises coupling the detecting structure to an analyzing circuit, wherein the analyzing circuit comprises:
(i) N detecting circuits electrically coupled one-to-one to the N detectors of the detecting structure, wherein each detector of the N detectors is configured to generate a current pulse to the corresponding detecting circuit of the N detecting circuits in response to a particle incident on the detector,
(ii) a collecting circuit electrically coupled to the N detecting circuits, and
(iii) a computer electrically connected to the collecting circuit.

14. The method of claim 13, wherein each detecting circuit of the N detecting circuits comprises:
(a) a pre-amplifier electrically coupled to the corresponding detector of the N detectors of the detecting structure;
(b) an amplifier electrically coupled to the pre-amplifier; and
(c) a discriminator electrically coupled to the amplifier and the collecting circuit, wherein the pre-amplifier is configured to receive the current pulse from the corresponding detector of the N detectors and convert the current pulse to a voltage pulse, wherein the amplifier is configured to magnify the voltage pulse into a magnified voltage pulse, wherein the pre-amplifier and the amplifier are configured such that if the incident particle has an energy of at least a pre-specified energy, then the magnified voltage pulse has an amplitude of at least a pre-specified discriminating amplitude value, wherein the discriminator is configured to generate an output pulse in response to the amplitude of the magnified voltage pulse being greater than the pre-specified discriminating amplitude value, wherein the collecting circuit comprises a counter, and wherein the counter is configured to increment its count by one in response to receiving the output pulse from the discriminator.

15. The method of claim 13, wherein each detecting circuit of the N detecting circuits comprises:

(i) a pre-amplifier electrically coupled to the corresponding of the N detectors of the detecting structure, and (ii) an amplifier electrically coupled to the pre-amplifier, wherein the pre-amplifier is configured to receive the current pulse from the corresponding detector of the N detectors and convert the current pulse to a voltage pulse, wherein the amplifier is configured to magnify the voltage pulse into a magnified voltage pulse, wherein the collecting circuit comprises an ADC (Analog to Digital Converter) circuit, wherein the ADC circuit is configured to generate a digital output in response to receiving the magnified voltage pulse from the amplifier, and wherein the computer is configured to increment an internal count by one in response to a value of the digital output being greater than a pre-specified value.

* * * * *